(12) United States Patent
Gillard et al.

(10) Patent No.: US 7,846,310 B2
(45) Date of Patent: Dec. 7, 2010

(54) ENCAPSULATED AND WATER COOLED ELECTROMAGNET ARRAY

(75) Inventors: Andrew Gillard, Mountain View, CA (US); Anthony Vesci, San Jose, CA (US); Keith A. Miller, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 888 days.

(21) Appl. No.: 11/610,075

(22) Filed: Dec. 13, 2006

(65) Prior Publication Data

US 2008/0141939 A1    Jun. 19, 2008

(51) Int. Cl.
*C23C 14/35* (2006.01)
(52) U.S. Cl. .......... 204/298.16; 118/620; 118/621; 118/723 R; 204/298.01; 204/298.31; 156/345.1
(58) Field of Classification Search ............ 204/298.16, 204/298.31; 118/723 R, 621; 438/9, 485, 438/513; 216/58, 67, 68, 70; 156/345.1
See application file for complete search history.

(56) References Cited

U.S. PATENT DOCUMENTS

| | | | | | |
|---|---|---|---|---|---|
| 4,894,510 | A | * | 1/1990 | Nakanishi et al. | 219/121.43 |
| 5,985,092 | A | * | 11/1999 | Chiu et al. | 156/345.25 |
| 2005/0263390 | A1 | * | 12/2005 | Gung et al. | 204/192.17 |

* cited by examiner

*Primary Examiner*—Nam X Ngueyn
*Assistant Examiner*—Jason M Berman
(74) *Attorney, Agent, or Firm*—Law Offices of Charles Guenzer

(57) ABSTRACT

A electromagnet array structure including multiple electromagnetic coils captured in a rigid encapsulant, for example, of cured epoxy resin, to form a unitary free-standing structure which can be placed around the walls of a plasma processing chamber. A liquid cooling coil may also be captured in the encapsulant between the electromagnetic coils. The structure may additionally include water fittings, locating pins, through tubes for chamber bolts, and lifting brackets.

21 Claims, 4 Drawing Sheets

US 7,846,310 B2

ENCAPSULATED AND WATER COOLED ELECTROMAGNET ARRAY

FIELD OF THE INVENTION

The invention relates generally to plasma processing of substrates. In particular, the relates to the RF coils and auxiliary magnets, for example, electromagnets used in a sputter reactor, most particularly in a multi-step process.

BACKGROUND ART

Sputtering, alternatively called physical vapor deposition (PVD), is used to deposit several different layers of metals and related materials in the fabrication of semiconductor integrated circuits. In two related and demanding applications, first a thin barrier layer is sputtered onto the walls and bottom of a narrow hole etched into and often through an inter-level dielectric layer, most typically composed of silicon oxide or similar oxide materials. The barrier layer prevents the migration of metal into the oxide and oxygen into the metal filling the via hole. For copper metallization, the barrier layer is often composed of tantalum, for example, a bilayer of Ta/TaN. Then a thin seed layer of copper is deposited over the barrier layer to serve both as a seed layer and an electroplating electrode for the subsequent filling of copper into the hole The remainder of the hole is then filled with a metal to serve as an electrical connection either vertically in a via penetrating the dielectric layer or horizontally in a trench interconnect formed in the surface of the dielectric layer. The barrier layer prevents diffusion between the metal and the oxide dielectric and thereby prevents oxygen from degrading the metal conductivity and metal from decreasing the resistivity of the dielectric.

Both the tantalum barrier and the copper seed are preferably deposited by DC magnetron sputtering because of its speed and relatively low cost of equipment and source materials. However, sputter deposition into the deep and narrow via holes, that is, having a high aspect ratio, is difficult because sputtering is fundamentally a ballistic process with a nearly isotropic angular distribution pattern of sputtered ions. not immediately amenable to coating the sidewalls or even bottom of high aspect-ratio holes. This difficulty has in large part addressed by assuring that a large fraction of the sputtered atoms are ionized and then applying a strong electrical bias to the wafer so that the sputter ions are accelerated towards the wafer in much more vertical angular distribution and penetrate deep within the vias. The uniformity of these ionized sputter processes, particularly when applied to 300 mm wafer in a reasonably sized sputter chamber, has presented further challenges. Increasingly, auxiliary magnets are placed along the sidewalls of the sputter chamber to confine and guide the sputter ions.

Commercial sputter equipment needs to be precise, easy to align, and relatively inexpensive to fabricate and operate.

SUMMARY OF THE INVENTION

An array of multiple electromagnetic coils may be disposed as annular coils around the sidewalls of a plasma processing chamber to control the plasma. According to one aspect of the invention, the electromagnetic coils are encapsulated in a plastic to fix the coils with respect to each other. An advantageous configuration includes four electromagnetic coils in a rectangular array.

According to another aspect of the invention, one or more electromagnetic coils may be encapsulated in a plastic together with a fluid cooling coil. Advantageously, the cooling coil is disposed between two radially spaced electromagnetic coils or disposed radially between two radially spaced pairs of two axially spaced electromagnetic coils.

The encapsulant may also capture multiple lifting brackets, alignment pins, and pass tubes for bolts fixing the coil assembly to the chamber. A terminal bracket may be attached to the encapsulant and include terminal for both ends of the magnet wires for the multiple electromagnetic coils.

The unitary body may be formed by pre-winding the electromagnetic coils and placing them together with the cooling coil, if used, into a mold into which a curable resin is flowed and then cured.

DETAILED DESCRIPTION OF THE PREFERRED EMBODIMENTS

Gung et al. describe an advanced plasma sputter chamber in U.S. patent application Ser. No. 11/119,350, filed Apr. 29, 2005, now published as U.S. Patent Application Publication 2005/0263390, and incorporated herein by reference. The Gung chamber was developed for sputtering a refractory barrier layer, but we believe that a similar chamber can be used for sputtering copper seed layer as well as other materials.

Figure 1:
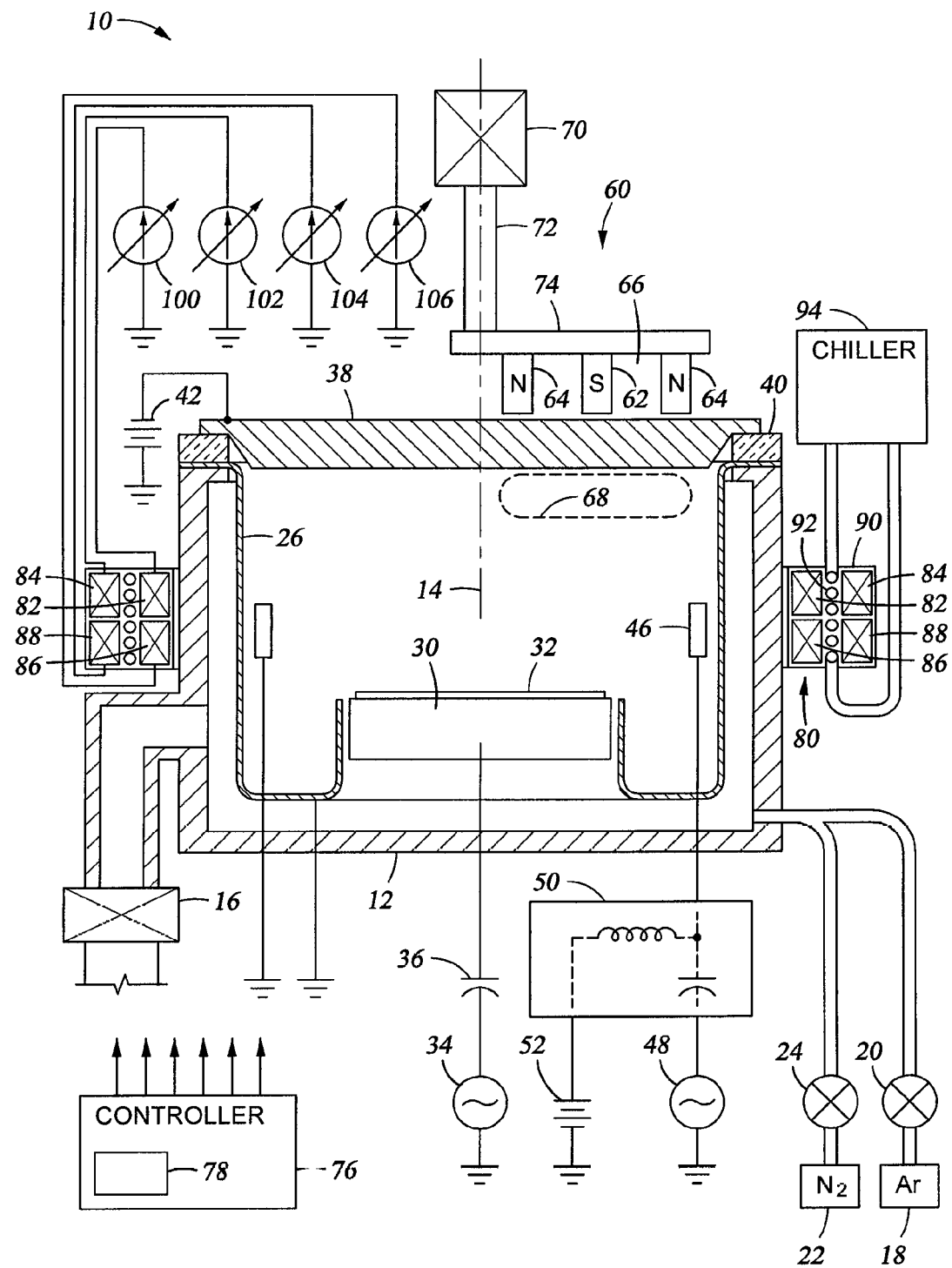
FIG. 1 is a cross sectional view of a plasma sputter chamber incorporating the electromagnet array of the invention.

Such a magnetron sputter chamber 10, schematically illustrated in cross section in FIG. 1, can effectively sputter thin films of Ta and TaN or alternatively Cu into holes having high aspect ratios and can further act to plasma clean the substrate and selectively etch portions of the deposited tantalum-based films. The sputter chamber 10 includes a vacuum chamber 12 arranged generally symmetrically about a central axis 14. A vacuum pump system 14 pumps the chamber 12 to a very low base pressure in the range of $10^{-6}$ Torr. However, a gas source 18 connected to the chamber through a mass flow controller 20 supplies argon as a sputter working gas. The argon pressure inside the chamber 12 is typically held in the low milli-Torr range. A second gas source 22 supplies nitrogen gas into the chamber through another mass flow controller 24 when tantalum nitride is being deposited. An electrically grounded shield 26 protects the chamber walls and the pedestal side from sputter deposition and provides an electrical anode for the plasma excitation process.

A pedestal 30 arranged about the central axis 14 holds a wafer 32 or other substrate to be sputter coated. An unillustrated clamp ring or electrostatic chuck may be used to hold the wafer 32 to the pedestal 30. An RF power supply 34 is connected through a capacitive coupling circuit 36 to the pedestal 30, which is conductive and act as an electrode. In the presence of a plasma, the RF biased pedestal 30 develops a negative DC bias, which is effective at attracting and accelerating positive ions in the plasma. The electrically grounded shield 26 protects the chamber walls and the sides of the pedestal 30 from sputter deposition. A target 38 is arranged in opposition to the pedestal 30 and is vacuum sealed to the chamber 12 through an isolator 40. At least the front surface of the target 38 is composed of a metallic material to be deposited on the wafer 32, in this case, tantalum.

A DC power supply 42 electrically biases the target 38 to a negative voltage with respect to the grounded shield 26 to cause the argon to discharge into a plasma such that the positively charged argon ions are attracted to the negatively biased target 38 and sputter tantalum from it, some of which falls upon the wafer 32 and deposits a layer of the tantalum target material on it. In reactive sputtering, reactive nitrogen gas is additionally admitted from the nitrogen source 18 into the chamber 12 to react with the tantalum being sputtered to cause the deposition of a tantalum nitride layer on the wafer 32.

In the case of barrier sputtering, the sputter chamber 10 additionally includes an inductive coil 46, preferably having one wide turn wrapped around the central axis 14 just inside of the grounded shield 26 and positioned above the pedestal 30 approximately one-third of the distance to the target 38. The RF coil 46 is supported on the grounded shield 26 or another inner tubular shield but electrically isolated therefrom, and an electrical lead penetrates the shield 26 and sidewalls of the chamber 12 to power the RF coil 46. Preferably, the RF coil 46 is composed of the same barrier material as the target 38. An RF power supply 48 applies RF current to the RF coil 46 through a DC/RF impedance matching circuit 50 to induce an axial RF magnetic field within the chamber and hence generate an azimuthal RF electric field that is very effective at coupling power into the plasma and increasing its density. The inductively coupled RF power may be used as the primary plasma power source when the target power is turned off and the sputter chamber 10 is being used to etch the wafer 32 with argon ions or for other purposes. The inductively coupled RF power may alternatively act to increase the density of the plasma extending to the target 38. The RF coil 46 may be relatively wide and be composed of tantalum to act as a secondary sputtering target under the proper conditions. A DC power supply 52 also applies a DC voltage to the inductive coil 46 through the DC/RF impedance matching circuit 52 so that the inductive coil 56 may additionally act to confine the plasma and guide the ions.

The target sputtering rate and sputter ionization fraction of the sputtered atoms can be greatly increased by placing a magnetron 60 in back of the target 38. The magnetron 60 preferably is small, strong, and unbalanced. The smallness and strength increase the ionization ratio and the imbalance projects a magnet field into the processing region for at least two effects of guiding sputtered ions to the wafer and reducing plasma loss to the walls. Such a magnetron includes an inner pole 62 of one magnetic polarity along the central axis 14 and an outer pole 64 which surrounds the inner pole 62 and has the opposite magnetic polarity. A gap 66 of substantially constant width is formed between the poles 62, 66 in a closed loop. The magnetic field extending between the poles 62, 64 in front of the target 38 creates a high-density plasma region 68 adjacent the front face of the target 38, which greatly increases the sputtering rate. The closed-loop gap 66 defines a plasma track or loop in the high-density plasma region 68 which has not end loss. The magnetron 60 is unbalanced in the sense that the total magnetic intensity of the outer pole 64, that is, the magnetic flux integrated over its area, is substantially greater than that of the inner pole, for example, by a factor of two or more. The unbalanced magnetic field projects from the target 38 toward the wafer 32 to extend the plasma and to guide sputtered ions to the wafer 32 and reduce plasma diffusion to the sides. To provide a more uniform target sputtering pattern, the magnetron 60 may be formed in a triangular or racetrack shape that is asymmetrical about the central axis 14, but a motor 70 drives a rotary shaft 72 extending along the central axis 14 and fixed to a plate 74 supporting the magnetic poles 62, 64 to rotate the magnetron 60 about the central axis 14 and produce an azimuthally uniform time-averaged magnetic field. If the magnetic poles 62, 64 are formed by respective arrays of opposed cylindrical permanent magnets, the plate 74 is advantageously formed of a magnetic material such as magnetically soft stainless steel to serve as a magnetic yoke coupling the back sides of the two magnetic poles 62, 64 as well as mechanically supporting them.

A controller 76 contains a recordable data medium 78, such as a disk, which is loaded with a process recipe for achieving a desired structure in the wafer 32. The controller 76 accordingly controls the process control elements, for example, the vacuum system 16, the process gas mass flow controllers 20, 24, the wafer bias supply 34, the target power supply 42, the RF and DC coil supplies 48, 52, the magnetron motor 70 to control its rotation rate and hence the position of the magnetron 60, and the current supplies for an electromagnet array to be shortly described.

The sputter chamber 10 additionally includes a quadruple electromagnet array 80 positioned generally radially outwardly of the RF coil 46 on the exterior of the chamber 12. The quadruple electromagnet array 80 includes four solenoidal electromagnetic coils 82, 84, 86, 88 wrapped generally circularly symmetrically about the central axis 14 of the sputter chamber 10 and, according to one aspect of the invention, encapsulated in an annular unitary electromagnet assembly 90. The coils 82, 84, 86, 88 are preferably arranged in a two-dimensional array extending around the central axis 14. The nomenclature is adopted of the top inner magnet (TIM) 82, top outer magnet (TOM) 84, bottom inner magnet (BIM) 86, and bottom outer magnet (BOM) 88. According to another aspect of the invention, a fluid cooling coil 92 is also encapsulated in the annular body 90 and is vertically wound between the inner electromagnetic coils 82, 86 and the outer electromagnetic coils 84, 88. A chilling fluid, such as liquid water, passes through the cooling coil 92. A chiller 94 may recirculate the cooling water but single-pass cooling is possible.

The electromagnetic coils 82, 84, 86, 88 may each be separately powered, for example, by respective variable DC current supplies 102, 104, 106, 108, preferably bipolar DC supplies. Corresponding unillustrated grounds or return paths are connected to the other ends of the multi-wrap coils 82, 84, 86, 88. However, in the most general case, not all coils 82, 84, 86, 88 need be connected to a common ground or other common potential. Other wiring patterns are possible. All coils 82, 84, 86, 88 have at least one and preferably two end connections that are readily accessible on the exterior of the assembled chamber to allow connection to separate power supplies or other current paths and to allow easy reconfiguration of these connections, thereby greatly increasing the flexibility of configuring the chamber during development or for different applications. In production, it is possible that the number of current supplies 102, 104, 106, 108 may be reduced but the capability remains to selectively and separately power the four different coils 82, 84, 86, 88, preferably with selected polarities, if the need arises as the process changes for the sputter chamber 10. Further, current splitters and combiners and serial (parallel and anti-parallel) connections of coils can be used once the general process regime has been established.

The electromagnet array 80 differs from the Gung design in at least three respects, its encapsulation in a unitary annular electromagnet assembly 90, the separability of the free-standing electromagnet assembly 90 from the sputtering chamber, and the encapsulated cooling coil 92 placed between the electromagnet coils 82, 84, 86, 88.

Figure 2:
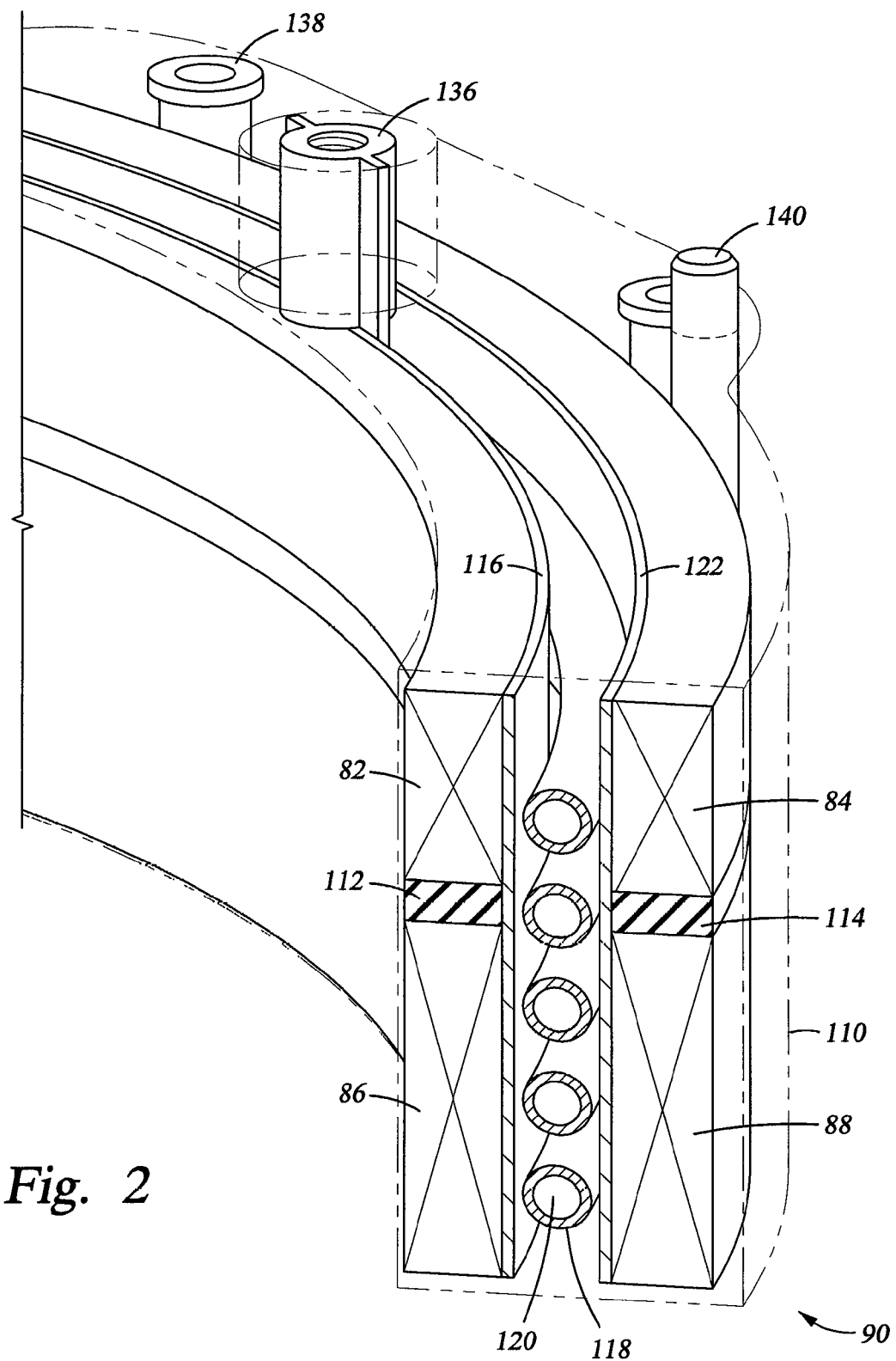
FIG. 2 is a sectioned orthographic view of an embodiment of the electromagnet assembly of the invention with the encapsulant shown in shadow.

A sectioned orthographic view of the electromagnet assembly 90 illustrated in FIG. 2 shows an encapsulant 110 in phantom lines. The inner and outer electromagnet coils 82, 84, 86, 88 include multiple turns of magnet wire in both the vertical and radial directions arranged with a generally rectangular cross section. The magnet wire is typically composed of copper and insulatively coated. Preferably, it has a square cross section. The coils are wound on cylindrical aluminum mandrels of differing diameters to account for the differing diameters of the inner coils 82, 86 and outer coils 84, 88. Although the number of turns in the coils may be varied, one embodiment includes 7×14 turns for the upper coils 82, 84 and 7×26 turns for the lower coils 86, 88. The inner coils 82, 86 may be wound together on the same mandrel with a washer-shaped inner spacer 112 vertically separating them. Similarly, the outer coils 84, 88 can be wound together on another mandrel with a washer-shaped outer spacer 114 vertically separating them. Both spacers 112, 114 are preferably formed of a non-magnetic dielectric such as G-10, a glass filled resin. Between windings of different layers of the electromagnet coils 82, 84, 86, 88, the magnet wire is painted with a thin, quick drying epoxy resin, such as 50-1000NP available from Epoxies, Etc. of Cranston, R.I. The cured epoxy is thermally conductive and binds the magnet wire into respective free-standing coils 82, 84, 86, 88. The two ends of the magnet wire extend away from the wound coils to provide for later electrical connection.

An optional assembly jig may be used to position the parts. A tubular inner shim 116 of aluminum is placed outside of the assembled inner coils 82, 86 and inner spacer 112. A cooling coil 118 of tubing of non-magnetic 300 Series stainless steel and having multiple turns in a helix extending along the vertical direction is placed outside of the inner shim 116. All stainless steel components are solution annealed to remove any residual magnetic characteristics. The cooling coil 118 contains a central axial passageway 120 for the circulation of cooling fluid. The cooling coil 118 is pre-wound on a mandrel to a slightly larger diameter and is tightened around the circumference of the inner shim 116. A tubular outer shim 122 of aluminum is placed outside the cooling coil 118. The shims 116, 122 are useful for facilitating thermal flow between the electromagnetic coils 82, 84, 86, 88 and the cooling coil 118 and controlling the radial dimensions of the electromagnet assembly 90 so that the encapsulated electromagnet array 80 has the same magnetic characteristics of the corresponding array in the Gung design. The two outer coils 84, 88 and outer spacer 114 are assembled around the circumference of the outer shim 122. The outer coils 84, 88 are vertically aligned to the inner coils 82, 86.

An alternative winding process uses a single winding mandrel. After the inner coils are wound, the shims and cooling coil are placed around them and the outer coils are wound on the radial outer surface of the developing assembly.

Figure 3:
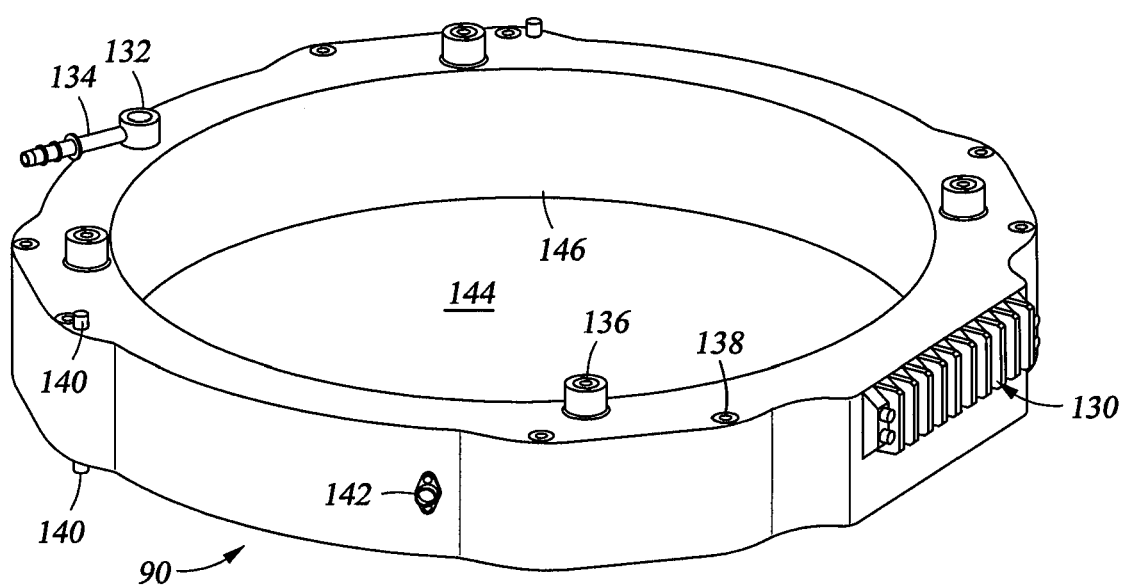
FIG. 3 is an orthographic view of the electromagnet assembly of FIG. 2 showing the encapsulated assembly and its external parts.

Further parts, also illustrated in the orthographic view of FIG. 3 of the electromagnet assembly 90, may be fit on the assembly jig. A nine-position terminal block 130 having additional terminals for external electrical connections is screwed to the encapsulation after curing. The eight ends of the magnet wires of the electromagnetic coils protrude from the encapsulant 110 and are connected to the terminal block 130. The ninth position grounds the cooling coil 118. Corresponding other terminals electrically connected to the first nine positions on the terminal block 130 are used either for external connection or for cross connection. Two water fittings 132 are welded to the opposite ends of the cooling coil 118 and extend axially above and below the electromagnet assembly 90. Barbs 134 can be screwed into the water fittings 132 after encapsulation to accept flexible water tubing for the supply and return of the cooling water. Four lifting brackets 136 are positioned above the electromagnet assembly and have central posts extending downwardly in the vicinity of the inner shim 116 to directly support the lower electromagnet coils 86, 88 when the electromagnet assembly 90 is being moved to and from the sputter chamber. The upper end of the lifting brackets 136 include internal threads to which a joist lifting may be detachably fitted. The lifting brackets 132 are mounted on the inner electromagnetic coils 82, 84 during winding on the mandrel. Eight pass through tubes 138 are positioned around the periphery of the electromagnet assembly 90 and have vertical pass through holes for bolts securing different levels of the chamber assembly. Pairs of locating pins 140 are located on the upper and lower surfaces of the electromagnet assembly 90 to fit with corresponding holes in the chamber levels above and below. Each pair are angularly separated by an angle other than 180° to assure correct alignment between levels. The terminal block 130, pass through tubes 138, and alignment pins 140 are located on radial extensions well outside the outer radius of the electromagnetic coils. A thermal switch 142 is mounted on the side of the electromagnet assembly 90 close to the electromagnetic coils. The thermal switch 142 may be installed after curing of the encapsulation. If the monitored temperature exceeds a predetermined shut down temperature, for example, 66° C., the electromagnet power supplies 100, 102, 104, 106 are shut down. The interlock prevents irreparable damage and personnel injury when the water cooling fails. The shut down temperature should be below the personnel safety limit of 80° C. set by SEMI S2 standards.

The assembled parts, except the terminal block 130, are placed in a mold having a general interior shape producing the unitary body of the electromagnet assembly 90 of FIG. 3. The assembled parts are placed upside in the mold from the illustrated orientation such that the lifting brackets 136 and locating pins 140 fit within recesses in the lower side of the mold. The assembly is then potted in an epoxy resin having a 94V-0 rating for dielectric strength. An example of such a resin is RBC-4501 available from R.B.C. Industries, Inc. of Warwick, Rhose Island. After potting, the mold is placed in an oven. The resin is impregnated into the entire assembly including between wraps of the water coil through one or more cycles of filling to eliminate any voids. The resin may be hardened for about 2 hours at 82° C. and cured for 8 hours at 100° C. to produce a rigid organic polymeric encapsulant that captures its components in fixed physical relationship and permits the electromagnet array to be handled without further support. The mold produces a unitary structure having an inner bore 144 inside of a cylindrical wall 146 symmetric about a central axis with a diameter sized to be slightly larger than the exterior surfaces of the chamber to which it is later mated.

The encapsulation serves several purposes. It produces a unitary assembly that can be easily handled. It isolates personnel from high-voltage parts. Only the terminal block 120 needs electrical box shields. It also conducts heat from the electromagnetic coils to the cooling coils. The encapsulation also captures the multiple electromagnets in fixed relative positions, thereby significantly reducing any mechanical deformation and increasing the accuracy of the initial winding when the electromagnet assembly is being handled in the field.

The location of the cooling coil between different magnetic coils to which they are bonded by the resin promotes cooler and more uniform temperatures for the electromagnets, thereby eliminating hot spots in the coil array which could deform the magnet wires. The uniform controlled heating also reduces drift in the magnetic field and thereby produces more consistent process results from wafer to wafer.

The Gung electromagnet array was wound directly on the adapter of the sputtering chamber, typically having flanges on its upper and lower sides. The electromagnet array described above, in contrast, is manufactured apart from the chamber in an annular shape having an interior circular surface having diameter that allows it to slide over an exterior surface of the adapter. Such a structure requires a redesigned adapter but provides several economic advantages. Different processes may require adapters of different lengths to vary the spacing between the target and the wafer. A single design of the electromagnet assembly can be combined with adapters of different lengths and possible other variations as long the diameters are maintained between the different adapters. Electromagnets are subject to failure and spares should be inventoried. A separable electromagnetic array allows inventorying spares of only the electromagnets and not of the adapters, which are much less subject to failure.

Figure 4:
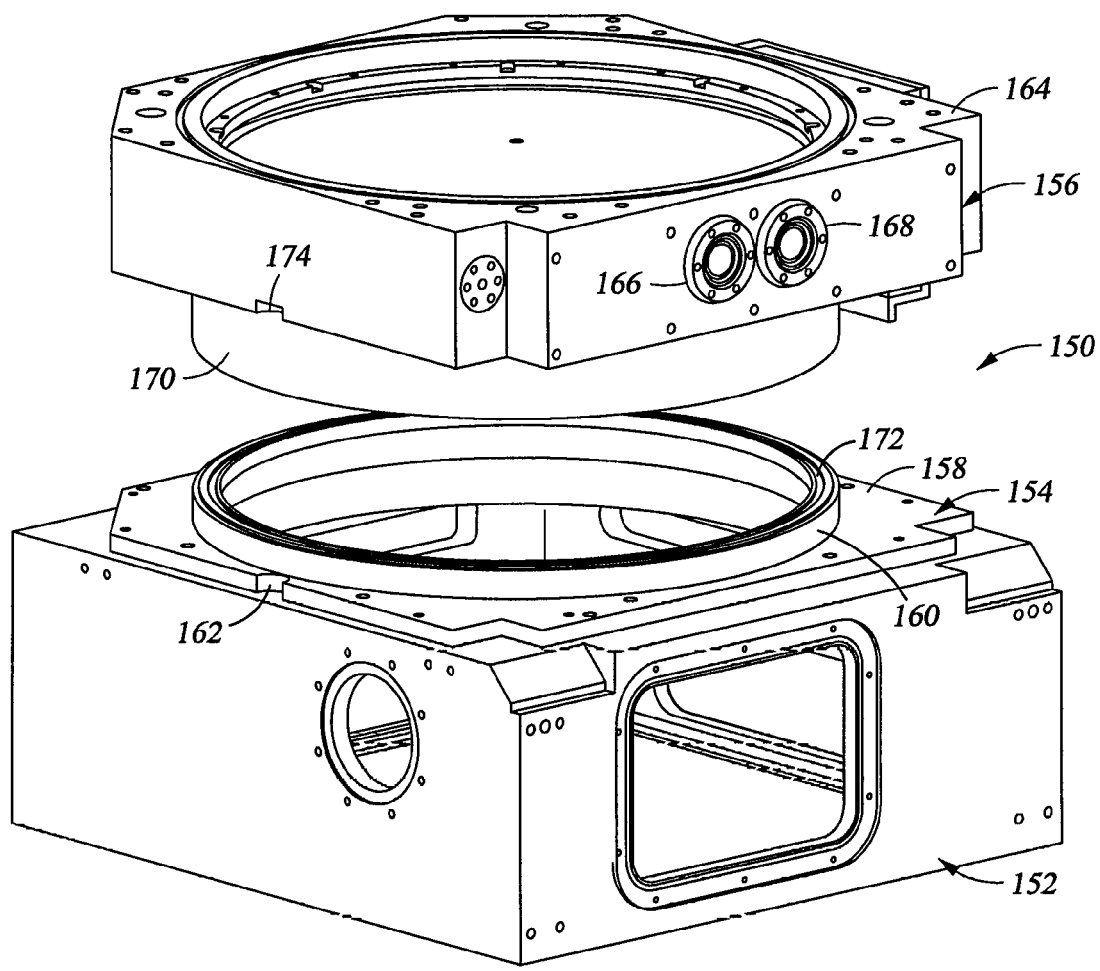
FIG. 4 is an orthographic view of a main chamber body and a two-piece adapter onto which the electromagnet assembly of FIG. 3 may be placed.

A chamber assembly 150 illustrated in the orthographic view of FIG. 4 includes a main chamber body 152, a lower adapter 154 sealed to the main chamber body 152, and an upper main adapter 156. The main chamber body 152 accommodates the pedestal 30 and includes a number of side apertures including a pumping port, a slit valve port, gas supply jets, and other ports for monitoring the main process. It is preferred that the main chamber body 152 not require separate design for different types of sputtering chambers but that most of the process specific design be confined to the adapter. Conventionally, a single adapter with upper and lower flanges was intermediate the main chamber body 152 and the target area. However, the illustrated chamber assembly 150 is designed to accept a separable electromagnet assembly and the adapter is divided into two parts. The lower adapter 154 includes a flange 158 supported on and sealed to the generally flat upper surface of the main chamber body 152. It also includes an inner rim 160 extending upwardly from the flange 158 and having an outer diameter over which the interior of the electromagnet assembly 90 can fit. It further includes an indentation 162 which accommodates the lower water fitting 132 of the electromagnet assembly 90. The main adapter 156 has a generally conventional flanged upper part 164 on which the target is supported and sealed and including two RF ports 166, 168 for powering the RF coil 46. The main adapter 156 also includes an inner barrel 170 descending from the flanged upper part 164 and also having an outer diameter over which the interior of the electromagnet assembly 90 can fit. The barrel 170 of the main adapter 156 is supported on and sealed to the rim 160 of the lower adapter 154 through an O-ring placed in an O-ring groove 172 in the top of the rim 150. The flanged upper part 164 also includes another indentation 174 which accommodates the upper water fitting 132

In final chamber assembly, the lower adapter 154 is sealed to the main chamber body 152. The electromagnet assembly 90 is slid down over the outside of the rim 160 and the lower alignment pins 140 align it to the adapter flange 158. The barrel 170 of the main adapter 156 is vertically lowered inside the electromagnet assembly 90 until it engages the rim 160 of the lower adapter 154. Bolts then are inserted from the top of the main adapter 156 through the through hole tubes 138 in the electromagnet assembly 90 and are threaded into corresponding holes in the flange 158 of the lower adapter 154. With a proper design of the attachment holes between the flange 158 of the lower adapter 154 and the main chamber body 152, it is possible to pre-assemble the adapter portions 154, 157 and the electromagnet assembly 90 and then lower them onto the main chamber body 152 for a final assembly. However, the resulting final assembly involves a much heavier set of parts and the need to seal blind parts on top of the main chamber body 152.

Although the wall 146 of the bore 144 of the electromagnet assembly 90 and the outer peripheries of the rim 160 and barrel 170 advantageously are circularly symmetric about the central axis 14 of the chamber, non-symmetric shapes are possible as long as they allow the electromagnet assembly 90 to fit around the outer peripheries of the rim 160 and barrel 170 or other corresponding chamber structures.

The invention is not limited to the described embodiments. The encapsulation of two or more electromagnets having at least three external leads fixes the multiple electromagnets with respect to each other during subsequent handling and use. The encapsulation of a cooling coil with one or more electromagnets facilitates the thermal flow between the electromagnetic coils and the cooling coil. The encapsulation of the cooling coil between at least two electromagnets is especially advantageous in efficiently cooling the electromagnets.

Although the invention has been applied to a magnetron sputter chamber, the electromagnet assembly of the invention may be applied to other plasma processing chambers such as plasma etch reactors.

The invention claimed is:

1. A plasma processing chamber and electromagnet array comprising:
   a plasma processing chamber;
   at least two electromagnet coils wrapped around a central axis and having at least three leads for providing independent powering of the different electromagnet coils; and
   a encapsulant capturing the wrapped electromagnet coils and forming a unitary structure having a central bore about the central axis and having two open and opposed axial ends, wherein the bore accommodates the plasma processing chamber therein.

2. The chamber and array of claim 1, further comprising a liquid cooling coil captured by the encapsulant.

3. The chamber and array of claim 2, wherein the liquid cooling coil is disposed between two of the electromagnet coils.

4. The chamber and array of claim 1, wherein there are four electromagnet coils arranged in a rectangular array.

5. The chamber and array of claim 4, further comprising a liquid cooling coiling wrapped around the central axis between pairs of the electromagnet coils and captured by the encapsulant.

6. The chamber and array of claim 1, further comprising a plurality of lifting brackets extending axially upwardly from a top axial surface of the encapsulant.

7. The chamber and array of claim 1, further comprising at least two locating pins extending respectively from a top axial surface and a bottom axial surface of the encapsulant.

8. The chamber and array of claim 1, further comprising a plurality of through tubes extending through the encapsulant parallel to the central axis for accepting bolts.

9. The chamber and array of claim 1, further comprising a pair of water fittings extending respectively from a top axial surface and a bottom axial surface of the encapsulant.

10. A plasma processing chamber and electromagnet assembly comprising:
a plasma processing chamber;
at least one electromagnet coil wound around a central axis;
a liquid cooling coil wound around the central axis adjacent to the at least one electromagnet coil; and
an encapsulant capturing the at least one electromagnet coil and the liquid cooling coil forming a unitary structure having a central bore about the central axis and having two open and opposed axial ends, wherein the bore accommodates the plasma processing chamber.

11. The chamber and assembly of claim 10, wherein the at least one electromagnet coil comprises two electromagnet coils with the liquid cooling coil disposed therebetween.

12. The chamber and assembly of claim 11, wherein the two electromagnet coils are wound at two radial positions about the central axis and the liquid cooling coil is wound at a third radial position between the two radial positions.

13. The chamber and array of claim 1, wherein the encapsulant surrounds the electromagnetic coils.

14. The chamber and array of claim 1, wherein the encapsulant after encapsulating the electromagnet coils is curable to form a rigid plastic.

15. The chamber and array of claim 2, wherein the cooling coil includes multiple wraps.

16. The chamber and array of claim 15, wherein the encapsulant after encapsulating the electromagnet coils and the cooling coil is curable to form a rigid plastic extending between the wraps of the cooling coil and capturing the electromagnet coils and the cooling coil in a fixed physical relationship.

17. The chamber and assembly of claim 10, wherein the encapsulant surrounds the at least one electromagnet coil and the cooling coil.

18. The chamber and assembly of claim 10, wherein the encapsulant after encapsulating the at least one electromagnet coil and the cooling coil is curable to form a rigid plastic.

19. A plasma processing chamber and electromagnet array comprising:
a plasma processing chamber; and
an electromagnet assembly fit around the plasma processing chamber and formed by the method comprising:
winding a first magnet wire into a first electromagnet coil;
winding a second magnet wire into a second electromagnet coil;
winding a tube into a cooling coil for passing a fluid along a length thereof;
disposing the cooling coil between the first and second electromagnet coils within a mold to form an assemblage of parts;
flowing a resin into the mold containing the assemblage and into the interstices between the first and second electromagnet and the cooling coils; and
curing the resin flowed into the mold and forming a free standing encapsulant around the assemblage.

20. The chamber and array of claim 19, wherein the second magnet coil is disposed radially outwardly in the assemblage from the first magnet coil and the cooling coil comprises a helical coil.

21. The chamber and array of claim 20, wherein the method further comprises:
winding a third magnet wire into a third electromagnet coil displaced axially from the first electromagnet coil; and
winding a fourth magnet wire into a fourth electromagnet coil displaced axially from the second electromagnet coil;
wherein the cooling coil is disposed between the third and fourth electromagnet coil.

* * * * *